US012777616B2

(12) United States Patent
Zhang et al.

(10) Patent No.: US 12,777,616 B2
(45) Date of Patent: Oct. 27, 2026

(54) SELF-ADJUSTING FLUID COOLING SYSTEM FOR ELECTRONIC DEVICE

(71) Applicant: SUGON DATAENERGY (BEIJING) CO., LTD., Haidian (CN)

(72) Inventors: Peng Zhang, Beijing (CN); Xintao Cui, Beijing (CN); Qiankun Chang, Beijing (CN); Jingnan Peng, Beijing (CN); Zhouli Wang, Beijing (CN)

(73) Assignee: SUGON DATAENERGY (BEIJING) CO., LTD., Beijing (CN)

( * ) Notice: Subject to any disclaimer, the term of this patent is extended or adjusted under 35 U.S.C. 154(b) by 266 days.

(21) Appl. No.: 18/721,977

(22) PCT Filed: Oct. 11, 2022

(86) PCT No.: PCT/CN2022/124540

§ 371 (c)(1),
(2) Date: Jun. 20, 2024

(87) PCT Pub. No.: WO2023/116132

PCT Pub. Date: Jun. 29, 2023

(65) Prior Publication Data

US 2025/0063691 A1 Feb. 20, 2025

(30) Foreign Application Priority Data

Dec. 20, 2021 (CN) ......................... 202111558541.2

(51) Int. Cl.

| | |
|---|---|
| ***H02B 1/052*** | (2006.01) |
| ***H05K 7/14*** | (2006.01) |
| ***H05K 7/20*** | (2006.01) |

(52) U.S. Cl.

CPC ..... *H05K 7/20327* (2013.01); *H05K 7/20509* (2013.01)

(58) Field of Classification Search

CPC ........... H05K 7/20327; H05K 7/20772; H05K 7/20509; H05K 7/20781; H05K 7/20254;

(Continued)

(56) References Cited

U.S. PATENT DOCUMENTS

| | | | | |
|---|---|---|---|---|
| 2002/0124585 A1* | 9/2002 | Bash | H05K 7/20354 257/E23.098 |
| 2011/0056225 A1* | 3/2011 | Campbell | H05K 7/20381 62/223 |

(Continued)

FOREIGN PATENT DOCUMENTS

| | | |
|---|---|---|
| CN | 109980317 A | 7/2019 |
| CN | 111629572 A | 9/2020 |

(Continued)

OTHER PUBLICATIONS

Gang CN107562155, A Liquid-cooled Server and its Flow Measuring Method, Jan. 9, 2018, PE2E Search translation (Year: 2018).*

(Continued)

*Primary Examiner* — Michael A Matey
(74) *Attorney, Agent, or Firm* — GREENBLUM & BERNSTEIN, P.L.C.

(57) ABSTRACT

The present invention relates to a self-adjusting fluid cooling system for an electronic device, comprising: cooling fluid flowing branches, the plurality of cooling fluid flowing branches being connected in parallel, and the cooling fluid flowing branches being connected to a cooling fluid driving member and a heat exchanger by means pipelines to form a fluid cooling circulation loop; cold plates, each cooling fluid flowing branch being provided with at least one cold plate, a cooling fluid in the cooling fluid flowing branches flowing through the cold plates, and each cold plate being used for contacting a corresponding heating area for heat exchange; and a plurality of adjusting modules, each adjusting module being provided corresponding to each cold plate, and the (Continued)

adjusting modules being configured to adjust the amount of the cooling fluid flowing through the corresponding cold plates.

12 Claims, 8 Drawing Sheets

(58) Field of Classification Search

CPC ........... H05K 7/20272; H05K 7/20263; H05K 7/20318; H05K 7/20809; H05K 7/20836; H05K 7/20309; H05K 7/20281; H05K 7/20727; H05K 7/20818; H05K 7/1488; H05K 7/20381; H05K 7/20763; H05K 1/0203; H05K 1/181; H05K 2201/064; H05K 7/14; G06F 1/20; G06F 2200/201; G06F 1/181

See application file for complete search history.

(56) References Cited

U.S. PATENT DOCUMENTS

| | | | | |
|---|---|---|---|---|
| 2011/0240281 | A1* | 10/2011 | Avery | H05K 7/20836 62/476 |
| 2014/0233175 | A1* | 8/2014 | Demange | H05K 7/20254 361/699 |
| 2014/0246178 | A1* | 9/2014 | Branton | H05K 7/20263 165/104.33 |
| 2015/0382514 | A1* | 12/2015 | Eriksen | H05K 7/20254 361/679.53 |
| 2021/0195804 | A1* | 6/2021 | Gao | H05K 7/20272 |
| 2021/0307199 | A1* | 9/2021 | Subrahmanyam | G06F 1/20 |
| 2021/0368655 | A1* | 11/2021 | Gao | H05K 7/20209 |
| 2022/0377942 | A1* | 11/2022 | Gao | H05K 7/20336 |
| 2023/0025554 | A1* | 1/2023 | Chen | G06F 1/206 |
| 2023/0309263 | A1* | 9/2023 | Gao | H05K 7/20327 |

FOREIGN PATENT DOCUMENTS

| | | | |
|---|---|---|---|
| CN | 113597215 | A | 11/2021 |
| JP | 2017161201 | A | 9/2017 |

OTHER PUBLICATIONS

Zhu CN113597215, System, method and device for adjusting flow of parallel branch of double-phase cold plate liquid cooling system, Nov. 2, 2021, PE2E search translation. (Year: 2021).*

Zhang, CN109713382, Electric vehicle battery panel cooling system and control method, May 3, 2019, PE2E search translation. (Year: 2019).*

International Search Report and Written Opinion in related PCT Application No. PCT/CN2022/124540, mailed Jan. 3, 2023,11 pages.

* cited by examiner

SELF-ADJUSTING FLUID COOLING SYSTEM FOR ELECTRONIC DEVICE

CROSS REFERENCE TO RELATED APPLICATION

The present application is a US national stage application of PCT international application PCT/CN2022/124540, filed on Oct. 11, 2022, which claims priority to Chinese Patent Application with No. 202111558541.2, entitled "Self-Adjusting Fluid Cooling System for Electronic Device", and filed on Dec. 20, 2021, the content of which is expressly incorporated herein by reference in its entirety.

TECHNICAL FIELD

The present disclosure relates to the field of heat dissipation technology of electronic devices, and particularly to a self-regulating fluid cooling system for an electronic device.

BACKGROUND

It is predicted that in 2040, electronic devices, especially data centers, may contribute 14% of the total global carbon emissions, which is more than half of the carbon emissions from the transportation sector. As the whole society implements the requirement of energy conservation and emission reduction, energy conservation and emission reduction of electronic devices are increasingly valued by manufacturers and users. Statistics show that in addition to the IT hardware of the data center itself consuming 50% of the total energy consumption of the data center, the energy consumption of the cooling system of the data center accounts for 30% to 40% of the total energy consumption of the data center. Accordingly, the cooling system for the electronic device has become an important part of the energy consumption. Therefore, the reduction of the energy consumption of the cooling system for the electronic device has become an important means for energy conservation and emission reduction in the whole society.

Liquid cooling technology is increasingly used in cooling electronic devices, and cold plates are becoming more and more widely used as a highly efficient cooling form. The conventional cold plate heat dissipation device is only a passive heating device, which cannot self-regulate the flow rate, temperature, pressure loss and other operating parameters according to different operating conditions, which may result in the problem that since the pipes at terminals have different lengths, different heat dissipation areas, different flow resistance characteristics caused by different structures, and different amounts of heat dissipation, etc., which causes thermal and hydraulic imbalance, complicates the system design, and meanwhile fails to result in the energy conversation of the cooling system.

In view of the above problem, the present disclosure provides a self-regulating liquid cooling system for an electronic device, which can self-regulate the cooling liquid flow required by each terminal according to the different flow resistance characteristics and heat power consumption of each terminal heating device, thereby not only contributing to improving the heat dissipation efficiency of the system and reducing the cooling cost, but also effectively increasing the utilization rate of the electronic device and the energy efficiency.

SUMMARY

In view of this, the present disclosure proposes a self-regulating fluid cooling system for an electronic device. The system can self-regulate the flow rate of the cooling fluid required by each terminal according to different flow resistance characteristics and heat power consumption of each terminal heating device, thereby not only contributing to improving the heat dissipation efficiency of the system and reducing the cooling cost, but also effectively increasing the utilization rate of the electronic device and the energy efficiency.

A self-regulating fluid cooling system for an electronic device may include:

a plurality of cooling fluid flow branches connected in parallel, wherein each cooling fluid flow branch is connected to a cooling fluid driver and a heat exchanger through a pipeline to form a fluid cooling circulation loop;

cold plates, wherein each cooling fluid flow branch is provided with at least one of the cold plates and cooling fluid in the cooling fluid flow branch flows through the cold plate, and each cold plate is configured to be in contact and exchange heat with a corresponding heating region;

a plurality of regulation modules, provided in a one-to-one correspondence with the cold plates, wherein the regulation module is configured to regulate a flow rate of the cooling fluid flowing through the corresponding cold plate.

In an embodiment, the system may further include a cooling fluid flow main path, the cooling fluid driver, and the heat exchanger, wherein the cooling fluid driver and the heat exchanger are both provided on the cooling fluid flow main path, inlet ends of the plurality of cooling fluid flow branches are connected to an outlet end of the cooling fluid flow main path, outlet ends of the plurality of cooling fluid flow branches are connected to an inlet end of the cooling fluid flow main path, the cooling fluid driver is configured to drive the cooling fluid to circulate, the heat exchanger is configured to cool down the cooling fluid.

In an embodiment, at least a part of components in the regulation module are dispersedly provided on the cooling fluid flow branch.

In an embodiment, the regulation module may include a controller, a first temperature measuring member, and a second temperature measuring member and a valve both of which are provided on the cooling fluid flow branch, the first temperature measuring member is located on an inlet side of the cold plate, the second temperature measuring member is located on an outlet side of the cold plate, the first temperature measuring member, the second temperature measuring member, and the valve are all electrically connected to the controller, the controller is configured to regulate an opening degree of the valve according to temperatures measured by the first temperature measuring member and the second temperature measuring member.

In an embodiment, components in the regulation module are integrated into one.

In an embodiment, the regulation module is provided on the cooling fluid flow branch at an outlet side of the corresponding cold plate.

In an embodiment, the system may further include a quick connector, wherein the regulation module is provided in the quick connector, the corresponding cold plate and the cooling fluid flow branch are both connected to the quick connector, and the quick connector is located at an outlet side of the cold plate.

In an embodiment, the system may further include a cooling fluid distribution unit in which a liquid collecting device is provided, wherein the outlet ends of the plurality of cooling fluid flow branches are all connected to the liquid collecting device, and a regulation module is provided at each connection between the liquid collecting device and each cooling fluid flow branch;

preferably, the cooling fluid distribution unit may include a liquid diverting device and the liquid collecting device, the inlet ends of the plurality of cooling fluid flow branches are connected to the liquid diverting device, the outlet ends of the plurality of cooling fluid flow branches are connected to the liquid collecting device, and a regulation module is provided at each connection between the liquid collecting device and each cooling fluid flow branch.

In an embodiment, the regulation module is provided inside the corresponding cold plate.

In an embodiment, the regulation module may include a temperature measuring member, a controller and a valve, the temperature measuring member and the valve are both electrically connected to the controller, the controller is configured to regulate an opening degree of the valve according to a temperature measured by the temperature measuring member.

In an embodiment, the regulation module may include a flow channel and at least one regulation member provided inside the flow channel, the regulation member is capable of deforming with temperature changes to regulate a flow size of the flow channel.

In an embodiment, the regulation module may include a flow channel and at least one regulation member provided in the flow channel, the regulation member is connected to a blocking member, the regulation member is configured to be capable of performing a phase change with temperature changes to drive the blocking member to move in the flow channel and regulate a flow size of the flow channel.

In an embodiment, the regulation module may include a flow channel and at least one regulation member provided in the flow channel, and a temperature-sensitive elastic member connected to the regulation member, the temperature-sensitive elastic member is configured to be capable of deforming with temperature changes to drive the regulation member to move in the flow channel and regulate a flow size of the flow channel.

In an embodiment, the regulation module may include a valve, a pressure of a cooling fluid flowing through the valve varies with a temperature to push the valve to open or close.

The above-mentioned cooling system is provided with a plurality of cooling fluid flow branches, each cooling fluid flow branch is provided with a cold plate, the cooling fluid in the cooling fluid flow branch flows through the cold plate, each cold plate is configured to be in contact and exchange heat with the corresponding heating region, each regulation module is arranged in a one-to-one correspondence with each cold plate, and the regulation module is configured to regulate the flow rate of the cooling fluid flowing through the corresponding cold plate. When cooling is performed, the regulation module can regulate the flow rate of the cooling fluid flowing through the cold plate according to the operating conditions of the corresponding cold plate to adapt to the heat dissipation requirements of the operating conditions of the cold plate. For example, if the temperature of the heating region in contact with a certain cold plate is higher, the flow rate of the cooling fluid flowing through the cold plate can be increased through the corresponding regulation module to enhance the heat exchange capacity of the cold plate, thereby better satisfying the heat dissipation requirements. Alternatively, if the temperature of the heating region in contact with a certain cold plate is lower, the flow rate of the cooling fluid flowing through the cold plate can be reduced through the regulation module to appropriately reduce the heat exchange capacity of the cold plate to avoid energy waste. Therefore, the cooling system can be adapted to perform targeted cooling and heat dissipation in a variety of different operating conditions at the same time, better satisfy the heat dissipation requirements of various operating conditions, and reduce the energy waste, thereby not only contributing to improving the heat dissipation efficiency of the system and reducing the cooling cost, but also effectively increasing the utilization rate of the electronic device and the energy efficiency.

REFERENCE SIGNS

Figure 1:
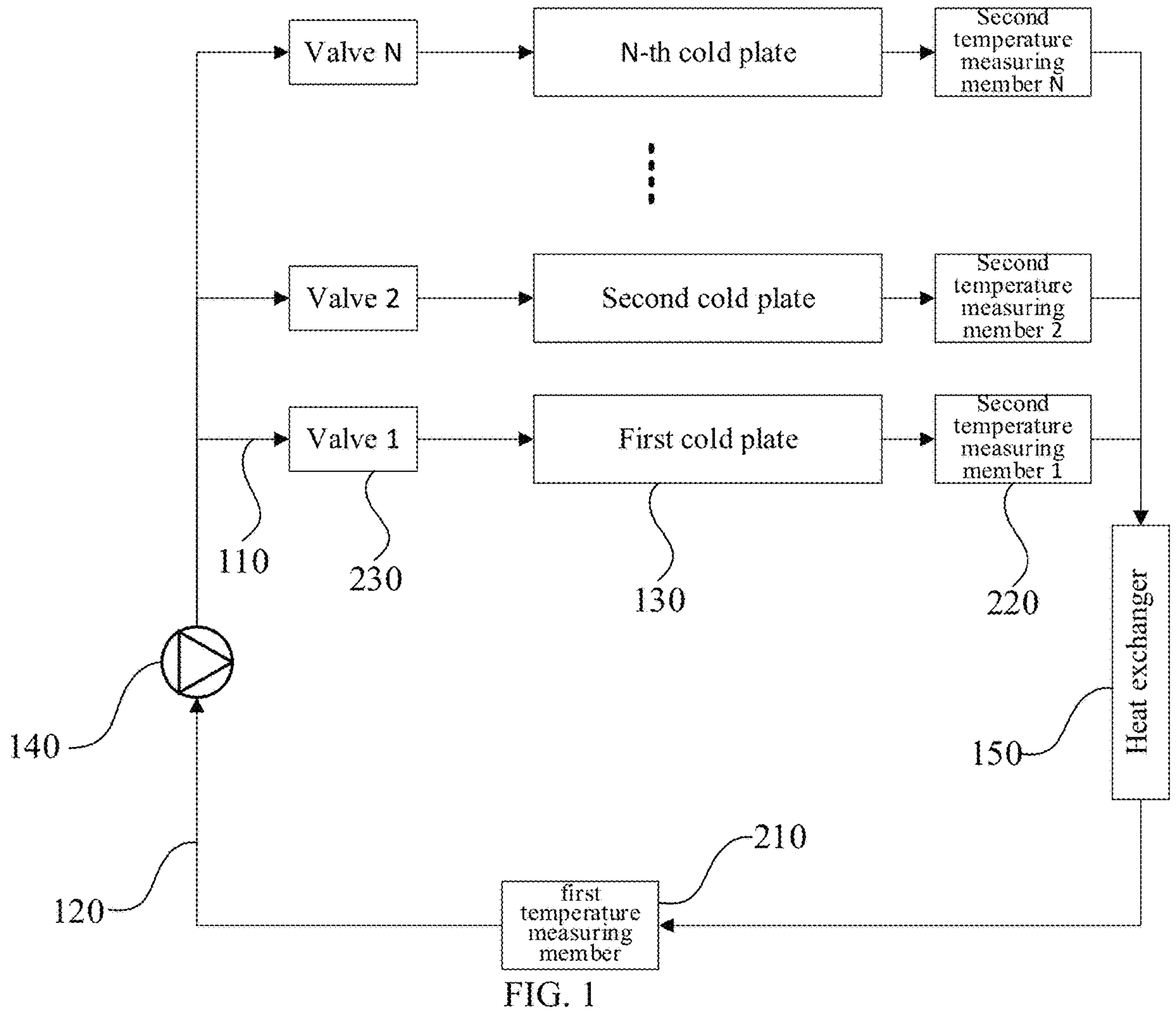
FIG. 1 is a schematic structure diagram of a cooling system according to an embodiment of the present disclosure.

110, cooling fluid flow branch; 120, cooling fluid flow main path; 130, cold plate; 140, cooling fluid driver; 150, heat exchanger;

210, first temperature measuring member; 220, second temperature measuring member; 230, valve;

300, second regulation module;

410, quick connector; 420, third regulation module;

510, liquid diverting device; 520, liquid collecting device; 530, fourth regulation module;

600, fifth regulation module 600;

710, first flow channel; 721, first regulation member; 722, second regulation member; 723, third regulation member; 7231, fixing portion; 7232, open-close portion; 730, first inlet; 740, first outlet; 750, first mounting member;

810, second flow channel; 820, fourth regulation member; 830, second inlet; 840, second outlet; 850, second mounting member; 860, blocking member;

910, third flow channel; 920, fifth regulation member; 930, third inlet; 940, third outlet; 950, third mounting member; 960, temperature-sensitive elastic member.

DETAILED DESCRIPTION OF THE EMBODIMENTS

In order to make the above-mentioned purpose, limitations and advantages of the present disclosure more obvious and easier to understand, the specific embodiments of the present disclosure will be elaborated below with reference to the accompanying drawings. In the following description, numerous specific details are set forth in order to provide a thorough understanding of the present disclosure. However, the present disclosure can be implemented in many other ways than those described herein, and those skilled in the art can make similar improvements without departing from the scope of the present disclosure. Therefore, the present disclosure is not limited to the specific embodiments described below.

In the description of the present disclosure, it should be understood that the orientations or positional relationships indicated by the terms "center", "longitudinal", "lateral", "length", "width", "thickness", "up", "down", "front", "rear", "left", "right", "vertical", "horizontal", "top", "bottom", "inside", "outside", "clockwise", "counterclockwise", "axial", "radial", "circumferential" and the like may be based on the orientations or positional relationships shown in the accompanying drawings, and are merely for the convenience of describing the present disclosure and simplifying the description, rather than indicating or implying that the referred device or element definitely has a specific orientation, constructed and operated in a specific orientation, and therefore should not be understood as limiting the present disclosure.

In addition, the terms "first" and "second" are used for descriptive purposes only and should not be understood as indicating or implying relative importance or implicitly indicating the quantity of the indicated technical features. Therefore, the features defined with the "first" or "second" may explicitly or implicitly include at least one of the features. In the description of the present disclosure, the wording "plurality" means at least two, for example, two, three, etc., unless otherwise clearly and specifically defined.

In the present disclosure, unless otherwise clearly stipulated and limited, the terms such as "installation", "connection", "coupling", "fixing" and the like should be understood in a broad sense. For example, the connection may be a fixed connection, a detachable connection, or an integral connection; alternatively, the connection may be a mechanical connection or an electrical connection; alternatively, the connection may be a direct connection or an indirect connection through an intermediate medium; alternatively, the connection may be an internal communication between two elements or an interaction relationship between two elements, unless otherwise clearly limited. For those skilled in the art, the specific meanings of the above terms in the present disclosure can be understood according to specific circumstances.

In the present disclosure, unless otherwise clearly specified and limited, that a first feature is "on" or "under" a second feature may mean that the first and second features are in direct contact with each other, or the first and second features are in indirect contact with each other through an intermediate medium. Moreover, that the first feature is "on", "above" and "on top" of the second feature may mean that the first feature is directly above or obliquely above the second feature, or simply means that the first feature is at a higher level than the second feature. That the first feature is "below," "beneath," or "under" the second feature may mean that the first feature is directly below or diagonally below the second feature, or simply means that the first feature is at a lower level than the second feature.

It should be noted that when an element is referred to as being "fixed to" or "provided on" another element, it may be directly on the other element or there may be an intermediate element. When an element is referred to as being "connected to" another element, it can be directly connected to the other element or there may be an intermediate element at the same time. The terms "vertical", "horizontal", "upper", "lower", "left", "right" and similar expressions used herein are for illustrative purposes only and do not represent the only implementation modes.

Referring to FIGS. 1 to 5, in an embodiment of the present disclosure, a self-regulating fluid cooling system for an electronic device is provided, which may include a plurality of cooling fluid flow branches 110 connected in parallel, and each cooling fluid flow branch 110 is connected to a cooling fluid driver 140 and a heat exchanger 150 through a pipeline to form a fluid cooling circulation loop. Each cooling fluid flow branch 110 is provided with at least one cold plate 130, and each cold plate 130 is configured to be in contact and exchange heat with a corresponding heating region to perform heat exchange. The cooling fluid in the cooling fluid flow branch 110 flows through the cold plate 130 to take away the heat transferred from the heating region (i.e., the terminal heating device) to the cold plate 130, thereby implementing the cooling of the heating region. The cooling system is further provided with a plurality of regulation modules, and each regulation module is provided to correspond to each cold plate 130. The regulation module is configured to regulate a flow rate of the cooling fluid flowing through the corresponding cold plate 130. During the cooling, the regulation module may regulate the flow rate of the cooling fluid flowing through the cold plate 130 according to the operating condition of the corresponding cold plate 130, to adapt to the heat dissipation requirement of the operating condition of the cold plate 130. For example, if the temperature of the heating region in contact with a certain cold plate 130 is high, the flow rate of the cooling fluid flowing through the cold plate 130 can be increased through the corresponding regulation module to improve the heat exchange capacity of the cold plate 130, thereby better satisfying the heat dissipation requirement. Alternatively, if the temperature of the heating region in contact with a certain cold plate 130 is low, the flow rate of the cooling fluid flowing through the cold plate 130 can be reduced through the regulation module to appropriately reduce the heat exchange capacity of the cold plate 130 to avoid energy waste. Therefore, the cooling system can be adapted to perform targeted cooling and heat dissipation for a variety of different operating conditions at the same time, to better satisfy the heat dissipation requirements of various operating conditions while reducing the energy waste, thereby not only contributing to improving the heat dissipation efficiency of the system and reducing the cooling cost, but also effectively improving the utilization rate of the electronic device and energy efficiency. That is, the cooling system can self-regulate the flow rate of the cooling fluid required by each terminal according to the different flow resistance characteristics and heat consumption of each terminal heating device, thereby not only contributing to improving the heat dissipation efficiency of the system and reducing the cooling cost, but also effectively improving the utilization rate of the electronic device and the energy efficiency.

Specifically, in some embodiments, the plurality of heating regions in contact with the plurality of cold plates 130 respectively may be a plurality of regions on the same heating component. The plurality of cold plates 130 in the cooling system can respectively perform the targeted heat dissipation on the plurality of heating regions with different heat quantities on the heating component, which can better satisfy the heat dissipation requirements of the regions, obtain a better heat dissipation effect, and is not prone to cause energy waste. Alternatively, in some embodiments, the plurality of heating regions that are respectively in contact with the plurality of cold plates 130 may also be a plurality of heating components. By using the plurality of cold plates 130 in the cooling system to perform the targeted heat dissipation on the plurality of heating components with different heat quantities, the heat dissipation requirements of the heating components can be better satisfied, the heat dissipation effect is better, and the energy waste is not prone to occur.

Referring to FIGS. 1 to 5, specifically, in some embodiments, the system may further include a cooling fluid flow main path 120, a cooling fluid driver 140, and a heat exchanger 150. The cooling fluid driver 140 and the heat exchanger 150 are both provided on the cooling fluid flow main path 120. The inlet ends of the plurality of cooling fluid flow branches 110 are communicated with the outlet end of the cooling fluid flow main path 120. The outlet ends of the plurality of cooling fluid flow branches 110 are connected to the inlet end of the cooling fluid flow main path 120. The cooling fluid driver 140 is configured to drive the cooling fluid to circulate. The heat exchanger 150 is configured to cool down the heated cooling fluid. Specifically, the cooling fluid driver 140 may be a suction pump, and the cooling fluid may be water or a similar liquid. When the device operates, the cooling fluid is caused through the operation of the suction pump to flow gradually from the inlet end towards the outlet end of the cooling fluid flow main path 120. From the perspective shown in the drawings, the cooling fluid is driven to flow clockwise in the cooling fluid flow main path 120. The low-temperature cooling fluid is split into a plurality of streams at the outlet end of the cooling fluid flow main path 120, respectively enters a plurality of parallel cooling fluid flow branches 110, and flows in the cooling fluid flow branches 110 to the cold plates 130. When the cooling fluid flows through the cold plate 130, it takes away the heat transferred from the corresponding heating region to the cold plate 130, thereby cooling the heating region. After the heat exchange, the temperature of the cooling fluid increases. When the cooling fluids in the plurality of cooling fluid flow branches 110 flow to the outlet ends of the cooling fluid flow branches 110, the plurality of cooling fluids converge and flow into the cooling fluid flow main path 120 together. When the cooling fluid flows in the cooling fluid main flow path 120 to the heat exchanger 150, the heat is exchanged and cooled in the heat exchanger 150, thereby lowering the temperature and becoming the low-temperature cooling fluid with sufficient cooling capacity again. Preferably, a temperature measuring component such as a temperature sensor or a thermometer is provided on the outlet side of the heat exchanger 150 on the cooling fluid flow main path 120 to detect whether the cooling fluid after the heat exchange and cooling reaches a preset low temperature state, in order to avoid insufficient heat exchange and insufficient cooling capacity. If the measured temperature is too high, new cooling fluid with a lower temperature can be added to replace part of the cooling fluid with a too high temperature, to lower the overall temperature of the cooling fluid and ensure a sufficient cooling capacity.

Referring to FIG. 1, in some embodiments, at least a part of components in the regulation module are dispersedly provided on the cooling fluid flow branch 110. With such an arrangement, if a part of the components in the regulation module fail, the failed components can be removed and replaced individually more conveniently without replacing the whole regulation module, which allows the operation to be more convenient and reduces the replacement cost. Specifically, in some embodiments, a part of the components in the regulation module are dispersedly provided on the cooling fluid flow branch 110, and other components are provided in other positions. Alternatively, in other embodiments, all components in the regulation module are dispersedly provided on the cooling fluid flow branch 110.

Referring to FIG. 1, in some embodiments, the regulation module may include a controller, a first temperature measuring member 210, and a second temperature measuring member 220 and a valve 230 both of which are provided on the cooling fluid flow branch 110. The first temperature measuring member 210 is located on an inlet side of the cold plate 130, and the second temperature measuring member 220 is located on an outlet side of the cold plate 130. The first temperature measuring member 210, the second temperature measuring member 220, and the valve 230 are all electrically connected to the controller. The controller regulates an opening degree of the valve 230 according to the temperatures measured by the first temperature measuring member 210 and the second temperature measuring member 220. Specifically, in the first regulation module shown in FIG. 1, the controller may be provided on the cooling fluid flow branch 110, or may be provided in another position outside the pipeline. The first temperature measuring member 210 located at the inlet side of the cold plate 130 is configured to detect the temperature of the cooling fluid before flowing into each cold plate 130. The second temperature measuring member 220 located at the outlet side of the cold plate 130 is configured to detect the temperature of the cooling fluid flowing out of the corresponding cold plate 130 after the heat exchange. The first temperature measuring member 210 and the second temperature measuring member 220 may be temperature sensors or components with temperature measurement functions such as thermocouples. The valve 230 may be a solenoid valve or other components. The first temperature measuring member 210, the second temperature measuring member 220, and the valve 230 are all connected to the controller in a communication connection mode, such as a Bluetooth connection or a WiFi connection. The temperatures detected by the first temperature measuring member 210 and the second temperature measuring member 220 are transmitted back to the controller, and the controller calculates a difference value according to the two temperatures. If the obtained temperature difference is too large, it indicates that the heat quantity of the heating region in contact with the cold plate 130 is great, and the cooling capacity of the cold plate 130 may be insufficient. Subsequently, the controller controls the valve 230 corresponding to the cold plate 130 to increase the opening degree thereof, thereby increasing the flow rate of the cooling fluid flowing through the cold plate 130 and improving the cooling capacity. If the obtained temperature difference is too small, it indicates that the heat quantity of the heating region in contact with the cold plate 130 is low, the cooling capacity of the cold plate is not fully utilized, and there may exist some waste. Subsequently, the controller controls the valve 230 corresponding to the cold plate 130 to reduce the opening degree thereof, thereby reducing the flow rate of the cooling fluid flowing through the cold plate 130 and appropriately reducing the cooling capacity. The reduced part of the cooling fluid can flow into the cooling fluid flow branch 110 with a high heat dissipation requirement and a high cooling fluid flow requirement, so that each cooling fluid flow branch 110 can have a better cooling effect.

FIGS. 2 to 5, in some embodiments, the components in the regulation module are integrated into one. In such a manner, when the components are assembled and disassembled, it is only needed to assemble or disassemble the components as a whole, the operation is more convenient, and the regulation module can be mounted in an appropriate position as needed to better match different usage scenarios.

Figure 2:
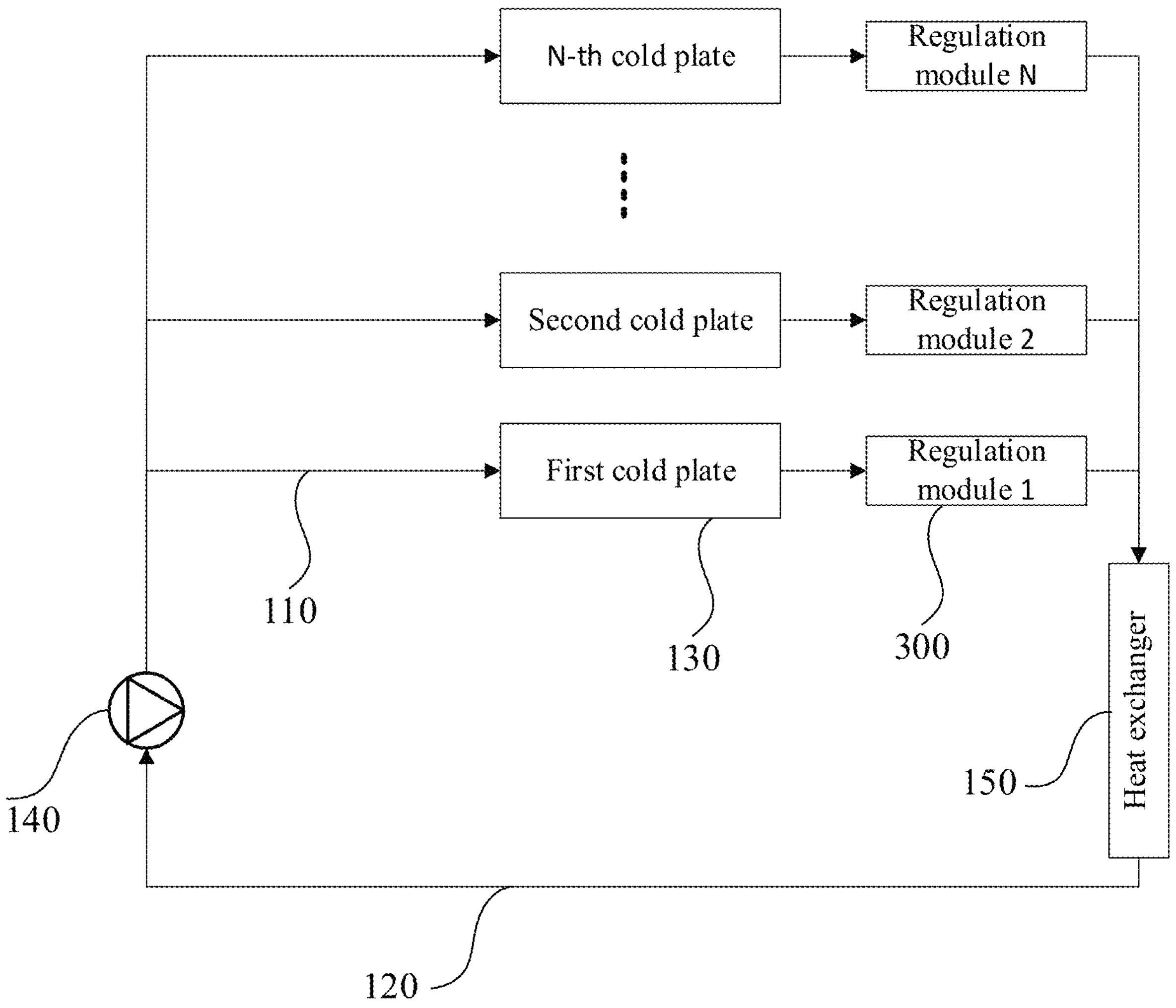
FIG. 2 is a schematic structure diagram of a cooling system according to an embodiment of the present disclosure.

Referring to FIG. 2, in some embodiments, the regulation module is provided on the cooling fluid flow branch 110 at the outlet side of the corresponding cold plate 130. In such a manner, the mounting and removing of the regulation module are more convenient. The regulation module can be mounted as a whole onto the cooling fluid flow branch 110, or removed as a whole from the cooling fluid flow branch 110. The second regulation module 300 shown in FIG. 2 is provided in a region on the cooling fluid flow branch 110 adjacent to the outlet side of the cold plate 130. By arranging the second regulation module 300 to be adjacent to the outlet side of the cold plate 130, the accuracy of the regulating the flow passing through the cold plate 130 according to the temperature of the cooling fluid flowing through the region on the cooling fluid flow branch 110 where the second regulation module 300 is located can be higher, because the temperature is approximate to the temperature of the cooling fluid at the cold plate 130. When the cold plate 130 operates, the second regulation module 300 may regulate the flow flowing through the cold plate 130 according to the temperature at the outlet side of the cold plate 130. For example, if the temperature at the outlet side of the cold plate 130 is too high, the flow flowing through the cold plate 130 is increased, or if the temperature at the outlet side of the cold plate 130 is low, the flow flowing through the cold plate 130 is appropriately decreased.

Figure 3:
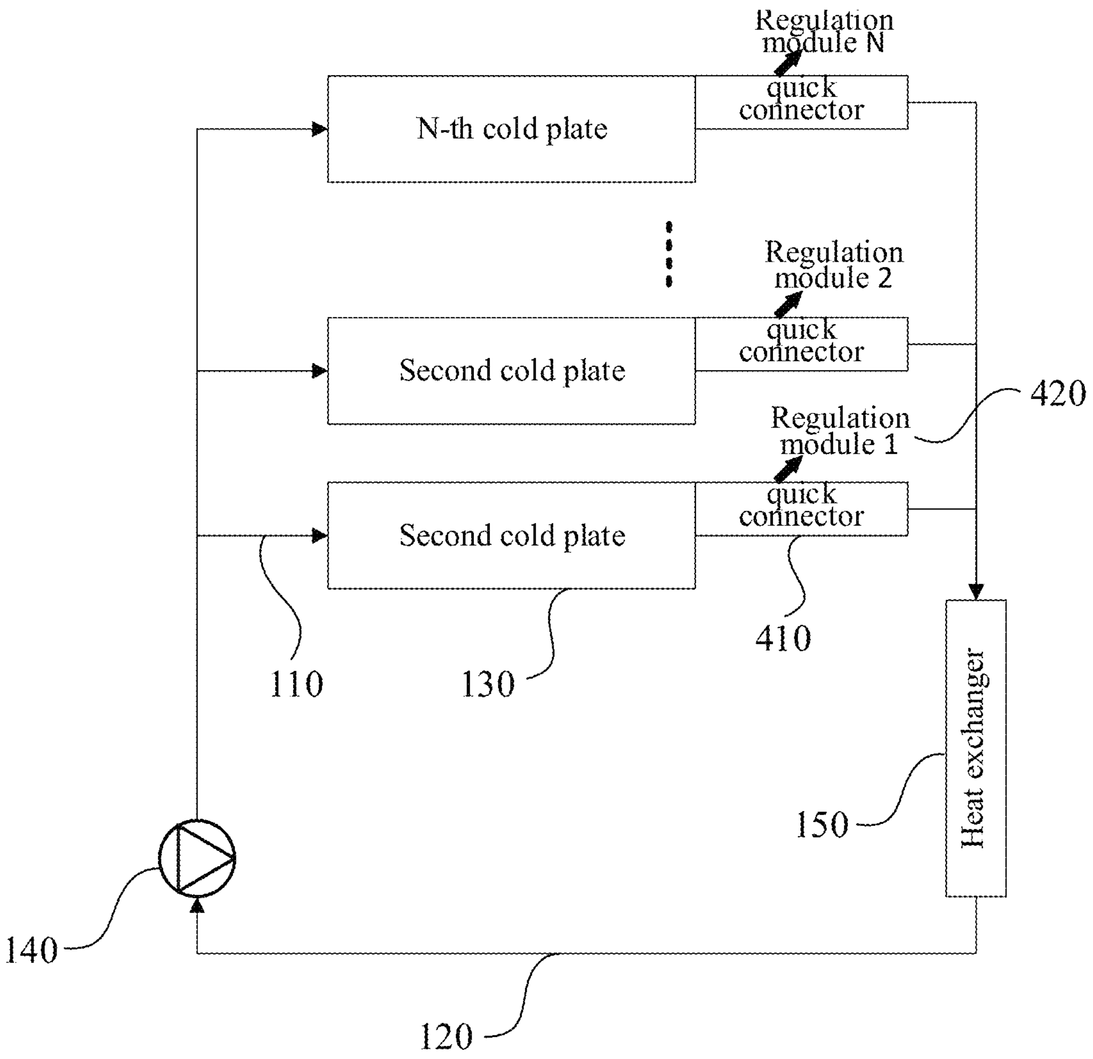
FIG. 3 is a schematic structure diagram of a cooling system according to an embodiment of the present disclosure.

Referring to FIG. 3, in some embodiments, the system may further include a quick connector 410. The regulation module is provided in the quick connector 410, the corresponding cold plate 130 and cooling fluid flow branch 110 are connected to the quick connector 410, and the quick connector 410 is located at the outlet side of the cold plate 130. In such an arrangement, the regulation module located inside can be protected by the quick connector 410, and the mounting and removing of the quick connector 410 are more convenient, i.e., the quick connector 410 only needs to be plugged in or unplugged in a preset position. Specifically, a third regulation module 420 shown in FIG. 3 is integrated in the quick connector 410, and the quick connector 410 is plugged into the outlet side of the cold plate 130. Each third regulation module 420 can regulate the flow flowing through the cold plate 130 according to the temperature of the cooling fluid flowing out of the corresponding cold plate 130. Specifically, one end of the quick connector 410 is plugged into the outlet side of the cold plate 130, and the other end is plugged into the cooling fluid flow branch 110. The quick connector 410 is directly plugged into the outlet side of the cold plate 130 and is thus closer to the cold plate 130, and the temperature based on which the flow rate is regulated is more accurate. Therefore, the accuracy of the regulation is higher, and the plug-in mounting mode is easy to operate.

Figure 4:
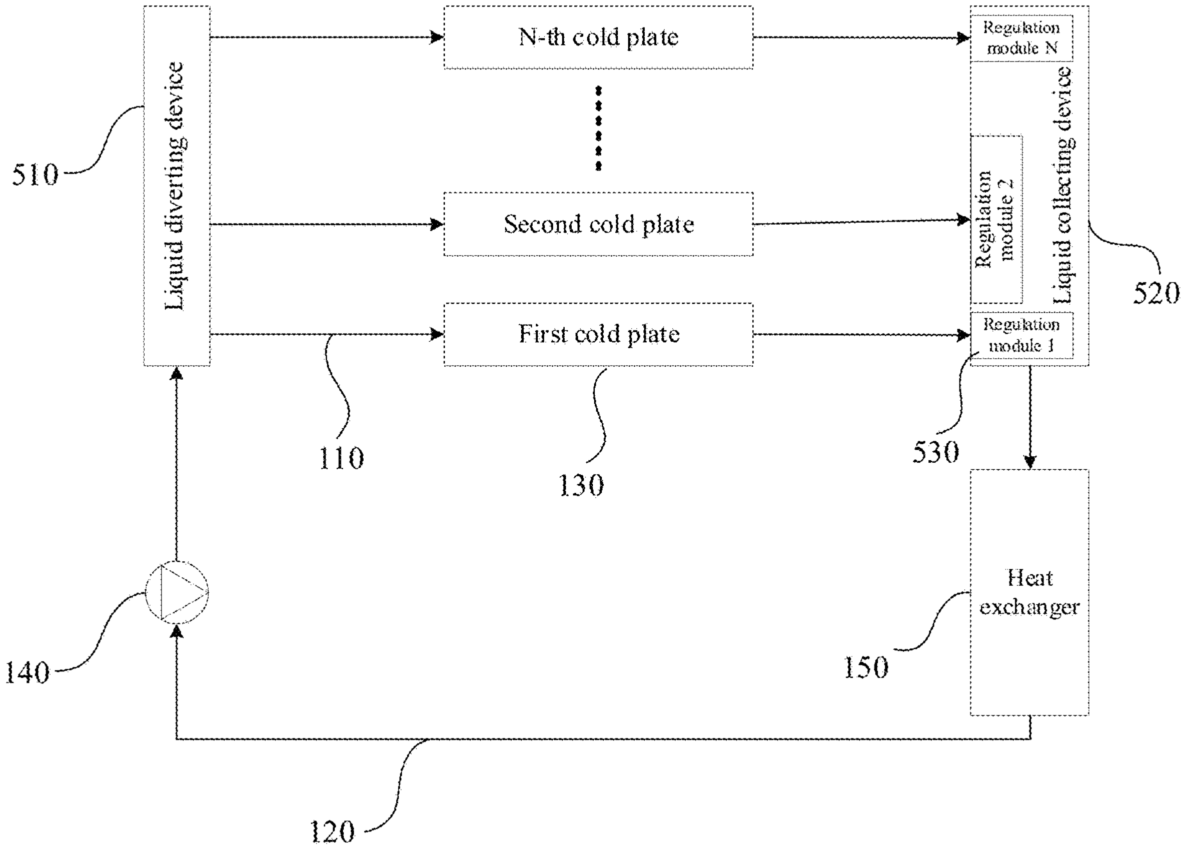
FIG. 4 is a schematic structure diagram of a cooling system according to an embodiment of the present disclosure.

Referring to FIG. 4, in some embodiments, the system may further include a cooling fluid distribution unit which includes a liquid collecting device 520. The outlet ends of the multiple cooling fluid flow branches 110 are all connected to the liquid collecting device 520, and a regulation module is provided at each connection between the liquid collecting device 520 and each cooling fluid flow branch 110. In such an arrangement, the regulation module integrated inside the liquid collecting device 520 can be protected by the liquid collecting device 520, and is more convenient to mount. The regulation module can be mounted simultaneously by simply mounting the liquid collecting device 520 with the regulation module inside to a preset position. Specifically, in the embodiment shown in FIG. 4, a fourth regulation module 530 is provided at each connection between the liquid collecting device 520 and each of the plurality of cooling fluid flow branches 110, and each fourth regulation module 530 can regulate the flow flowing through the corresponding cold plate 130 according to the temperature of the cooling fluid flowing into the liquid collecting device 520.

Furthermore, in some embodiments, the cooling fluid distribution unit may include a liquid diverting device 510 and a liquid collecting device 520. The inlet ends of the plurality of cooling fluid flow branches 110 are connected to the liquid diverting device 510, the outlet ends of the plurality of cooling fluid flow branches 110 are connected to the liquid collecting device 520, and a regulation module is provided at each connection between the liquid collecting device 520 and each of the plurality of cooling fluid flow branches 110. Of course, in other embodiments, the liquid diverting device 510 may not be provided, and the inlet ends of the plurality of cooling fluid flow branches 110 are directly connected to the cooling fluid flow main path 120.

Figure 5:
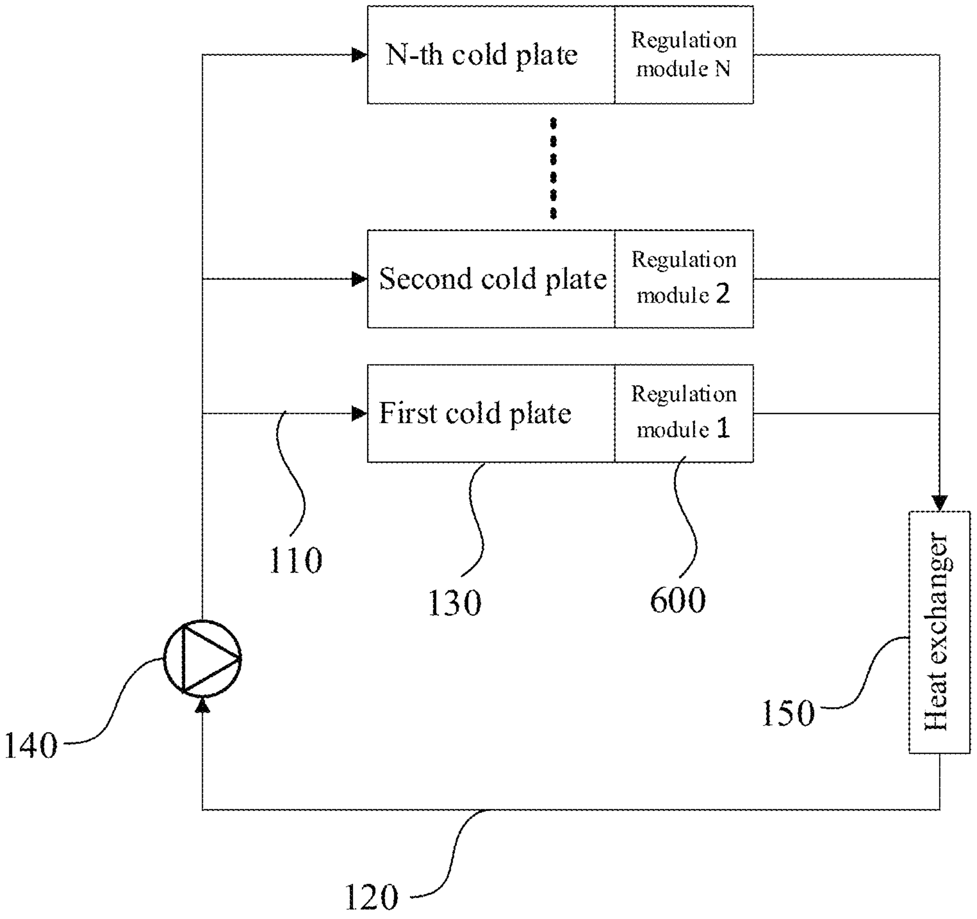
FIG. 5 is a schematic structure diagram of a cooling system according to an embodiment of the present disclosure.

Referring to FIG. 5, in some embodiments, the regulation module is provided inside the corresponding cold plate 130. Alternatively, the regulation module is provided inside the corresponding cold plate 130 and adjacent to the outlet side of the cold plate 130. By such an arrangement, the regulation module integrated inside the cold plate 130 can be protected by the cold plate 130, and is more convenient to mount. It is only necessary to mount the cold plate 130 with the regulation module inside to a preset position to simultaneously complete the mounting of the regulation module. That is, the cold plate 130 in the embodiment is a component with a built-in regulation function. Specifically, in the embodiment shown in FIG. 5, a fifth regulation module 600 is provided on a side of the cold plate 130 adjacent to the outlet. The operating condition of the cold plate 130 can be determined based on the acquired temperature of the cooling fluid that is heated after the heat exchange in the cold plate 130, and the flow rate of the cooling fluid flowing through the cold plate 130 can be adaptively regulated to regulate the heat dissipation capacity of the cold plate 130. Since the fifth regulation module 600 is directly provided inside the cold plate 130, the temperature of the high-temperature cooling fluid after the heat exchange in the cold plate 130 is obtained more accurately, and the temperature based on which the flow rate is regulated is more accurate, therefore the accuracy of the regulation is higher.

In the embodiments shown in FIG. 2 to FIG. 4, the regulation module may implement the regulation function in different modes, which will be specifically introduced in the following embodiments.

In some embodiments, the regulation module may include a temperature measuring member, a controller and a valve. The temperature measuring member and the valve are electrically connected to the controller. The controller regulates the opening degree of the valve according to the temperature measured by the temperature measuring member. The principle of the present embodiment is similar to that of the embodiment shown in FIG. 1, except that the components of the regulation module in FIG. 1 are not integrated together. Specifically, the temperature measuring member is configured to measure the temperature of the cooling fluid flowing through the region where the regulation module is located. The controller can regulate the valve opening according to the measured temperature, thereby regulating the flow flowing through the corresponding cold plate 130. In the embodiments shown in FIG. 2 to FIG. 4, the regulation module is provided at the outlet side of the cold plate 130 or adjacent to the outlet side of the cold plate 130, so that the temperature measuring member can measure the temperature of the cooling fluid at the outlet side of the cold plate 130 or adjacent to the outlet side. If the temperature measured by the temperature measuring member is too high, the controller controls the valve to increase the opening degree, thereby increasing the flow rate of the cooling fluid flowing through the cold plate 130 and enhancing the heat exchange capacity.

Figure 6:
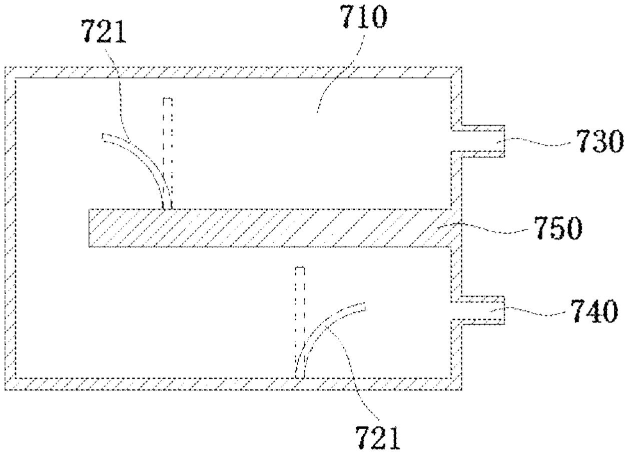
FIG. 6 is a schematic structure diagram of a regulation module of a cooling system according to an embodiment of the present disclosure.
Figure 7:
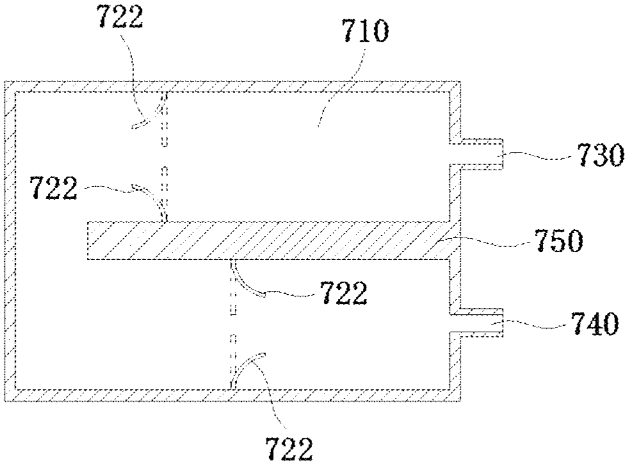
FIG. 7 is a schematic structure diagram of a regulation module of a cooling system according to an embodiment of the present disclosure.
Figure 8:
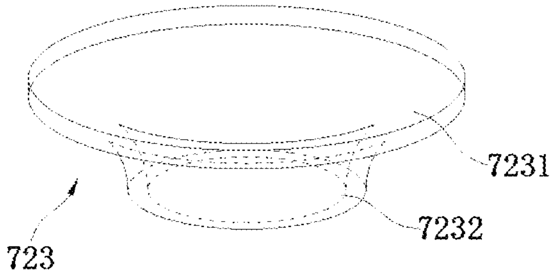
FIG. 8 is another schematic structure diagram of a regulation member of the regulation module in the embodiments shown in FIG. 6 and FIG. 7.

Referring to FIGS. 6 to 8, in some embodiments, the regulation module may include a flow channel and at least one regulation member provided inside the flow channel. The regulation member may deform with temperature changes to regulate a flow size of the flow channel. In such a manner, there is no need to measure the specific temperature of the cooling fluid, and the regulation function can be implemented through the deformation of the regulation member, which allows more convenient regulation. For example, referring to FIG. 6, the regulation module may include a first flow channel 710 and at least one first regulation member 721 provided in the first flow channel 710. The first regulation member 721 may deform with temperature changes to regulate the flow size of the first flow channel 710. It should be noted that the flow size refers to an inner circle size of a cross section of the first flow channel 710. If a flow direction in the first flow channel 710 is taken as an axial direction, the flow size is a radial size. A position indicated by dotted lines in the figure is a position of the first regulation member 721 without deformation. The cooling fluid flows into the first flow channel 710 from the first inlet 730 and flows out from the first outlet 740. At the same temperature, the deformation degrees of the material on both sides of the first regulation member 721 in the flow direction of the cooling fluid are different. Specifically, in the flow direction, the deformation coefficient on the front side is greater than the deformation coefficient on the rear side. Therefore, when the temperature of the cooling fluid in the first flow channel 710 changes, the deformation degree on the front side is greater than the deformation degree on the rear side, thereby implementing the bending deformation of the first regulation member 721 towards the front side of the flow direction. If the temperature of the cooling fluid in the first flow channel 710 is too high, the first regulation member 721 may bend and deform as shown by the solid lines in FIG. 6 to increase the flow size of the first flow channel 710, thereby increasing the flow rate of the first flow channel 710, and increasing the flow of the cooling fluid in the cold plate 130 corresponding to the regulation module. In the embodiments of FIGS. 2 to 5, the regulation module is either located inside the cold plate 130 or on the cooling fluid outlet side of the cold plate 130. The cooling fluid flowing through the cold plate 130 may also flow through the regulation module. Therefore, it is only necessary to change the flow rate through the first flow channel 710 in the regulation module to change the flow flowing through the corresponding cold plate 130, thereby implementing the regulation of the cooling capacity of the cold plate 130. Specifically, a first mounting member 750 extends from the inner wall of the first flow channel 710, and the first regulation member 721 extends from the first mounting member 750. The extending direction of the first regulation member 721 is perpendicular to the flow direction of the cooling fluid in the region where the first regulation member 721 is located. Of course, the first regulation member 721 may also extend directly from the inner wall of the first flow channel 710. Preferably, a plurality of first regulation members 721 are provided in the first flow channel 710, and the flow rate in the first flow channel 710 is jointly regulated by the plurality of first regulation members 721, to prevent the loss of the regulation function due to failure of one of the first regulation members 721.

Referring to FIG. 7, the principle shown in FIG. 7 is similar to that shown in FIG. 6, except that in FIG. 6 only one first regulation member 721 is provided in the same region inside the first flow channel 710 to regulate the flow size of the flow channel, while in FIG. 7 two second regulation members 722 are provided in the same region inside the second flow channel 810 to regulate the flow size of the flow channel through the cooperation of the two second regulation members 722. Specifically, one of the two second regulation members 722 in the same region inside the second flow channel 810 extends from the first mounting member 750, and the other extends from the inner wall of the first flow channel 710. When the temperature of the cooling fluid in the first flow channel 710 is lower, the two second regulation members 722 are not deformed, and there exists a small gap between the free ends of the two second regulation members 722 for the cooling fluid to flow through. If the temperature of the cooling fluid in the first flow channel 710 is too high, the two second regulation members 722 are bent and deformed towards the front side of the flow direction, so that the gap between the free ends of the two second regulation members 722 is increased, thereby increasing the flow size of the first flow channel 710.

Referring to FIG. 8, in addition to the first regulation member 721 shown in FIG. 6 and the second regulation member 722 shown in FIG. 7, a third regulation member 723 shown in FIG. 8 may also be used. The third regulation member 723 is trumpet-shaped and includes a fixing portion 7231 and an open-close portion 7232. A center of the fixing portion 7231 is open, one end of the open-close portion 7232 is connected to the fixing portion 7231, and the connection position is radially located outside the opening on the fixing portion 7231. Two regions on opposite sides of a circumferential surface of the fixing portion 7231 are fixed to the inner wall of the first flow channel 710 and the first mounting member 750 respectively. A center of the free end of the open-close portion 7232 has an opening, and the cooling fluid can flow from the center of the fixing portion 7231 through the opening in the center of the open-close portion 7232 and then flow out of the third regulation member 723.

Figure 9:
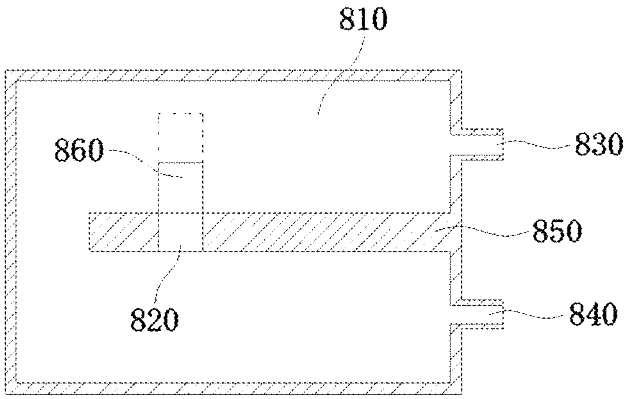
FIG. 9 is a schematic structure diagram of a regulation module of a cooling system according to an embodiment of the present disclosure.
Figure 10:
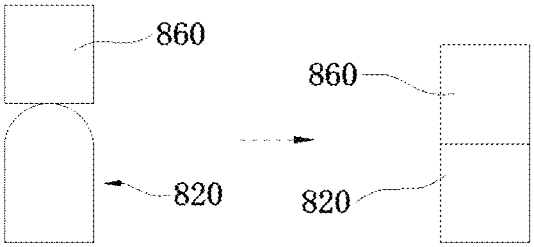
FIG. 10 is a schematic diagram illustrating structural changes of a blocking member and the regulation member in the embodiment shown in FIG. 9.

Referring to FIGS. 9 and 10, in some embodiments, the regulation module may include a flow channel and at least one regulation member provided in the flow channel, and the regulation member is further connected to a blocking member 860. The regulation member can perform a phase change with the temperature changes to drive the blocking member 860 to move in the flow channel and regulate the flow size of the flow channel. In such a manner, there is no need to measure the specific temperature of the cooling fluid, and the regulation function can be implemented through the phase change of the regulation member, which allows more convenient regulation. Specifically, the cooling fluid flows into the second flow channel 810 from the second inlet 830 and flows out from the second outlet 840. A second mounting member 850 extends from the inner wall of the second flow channel 810. A fourth regulation member 820 extends from the second mounting member 850 with the extending direction perpendicular to the flow direction of the cooling fluid in the region where the fourth regulation member 820 is located. The blocking member 860 is connected to an end portion of the fourth regulation member 820 away from the second mounting member 850. The fourth regulation member 820 is cylindrical, and a phase change material package is wrapped in a cylindrical housing. An end surface of the housing connected to the blocking member 860 is made of an elastic material, and other surfaces may be made of a metal material, such as copper. The phase change material package may perform the phase change when the temperature decreases, resulting in an increase in volume, which causes the end surface of the housing connected to the blocking member 860 to deform and protrude outwardly. When the temperature rises, the volume decreases, and the end surface of the housing is reset or even concave. Accordingly, when the temperature of the cooling fluid in the second flow channel 810 is lower, the phase change material package performs a phase change and pushes out the corresponding end surface of the housing, the blocking member 860 is also pushed out synchronously, and the flow size of the second flow channel 810 is reduced to appropriately reduce the cooling capacity of the cold plate 130 to avoid energy waste. When the temperature of the cooling fluid in the second flow channel 810 is higher, the phase change material package performs a phase change, and the corresponding end surface on the housing retracts, thereby causing the blocking member 860 to retract synchronously, and the flow size of the second flow channel 810 is increased to appropriately increase the cooling capacity of the cold plate 130 to satisfy the cooling requirement.

Figure 11:
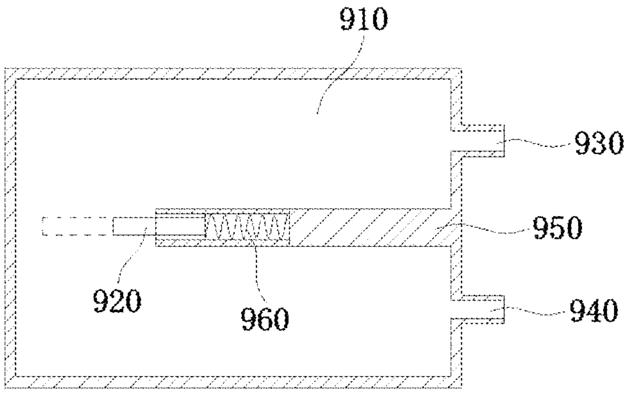
FIG. 11 is a schematic structure diagram of a regulation module of a cooling system according to an embodiment of the present disclosure.

Referring to FIG. 11, in some embodiments, the regulation module may include a flow channel and at least one regulation member provided in the flow channel, and a temperature-sensitive elastic member 960 connected to the regulation member. The temperature-sensitive elastic member 960 can deform with temperature changes to drive the regulation member to move in the flow channel and regulate the flow size of the flow channel. In such a manner, there is no need to measure the specific temperature of the cooling fluid, and the regulation function can be implemented by the temperature-sensitive elastic member 960 deforming with the temperature, which allows more convenient regulation. Specifically, the cooling fluid flows into the third flow channel 910 from the third inlet 930 and flows out from the third outlet 940. A third mounting member 950 extends from the inner wall of the third flow channel 910. A fifth regulation member 920 extends from the third mounting member 950, and the extending direction is parallel to the direction in which the third mounting member 950 extends from the inner wall of the third flow channel 910. The temperature-sensitive elastic member 960 may be a temperature-sensitive memory spring, which can extend or retract according to the temperature to push out or retract the fifth regulation member 920. For example, if the temperature of the cooling fluid in the third flow channel 910 is too high, the temperature-sensitive elastic member 960 retracts and the fifth regulation member 920 retracts accordingly, thereby increasing the flow size of the third flow channel 910. If the temperature of the cooling fluid in the third flow channel 910 is lower, the temperature-sensitive elastic member 960 extends and the fifth regulation member 920 extends accordingly, thereby appropriately reducing the flow size of the third flow channel 910. In the embodiment, the direction in which the fifth regulation member 920 extends from the third mounting member 950 may also be set to be similar to that in FIG. 6. Similarly, in the embodiments shown in FIG. 6, FIG. 7 and FIG. 9, the directions in which the corresponding regulation members extend from the corresponding mounting members may also be set to be similar to that in FIG. 11.

In some embodiments, the regulation module may include a valve. The pressure of the cooling fluid flowing through the valve may vary with the temperature to push the valve to open or close. With such an arrangement, if the temperature changes, the opening degree of the valve can be regulated by the pressure change of the cooling fluid itself, without needing to set up additional components to implement this. Specifically, an open-close member of the valve is elastic, and the pressure of the cooling fluid can change with the temperature. When the temperature increases, the pressure of the cooling fluid increases, which pushes the open-close member of the valve to open to a greater extent, and the valve is opened to a greater extent. When the temperature decreases, the pressure of the cooling fluid decreases, which pushes the open-close member of the valve to open to a lesser extent, and the valve is opened to a lesser extent. Alternatively, when the temperature changes, the cooling fluid performs a phase change, and the pressures before and after the phase change are different, so that the open-close member of the valve is pushed to open to different degrees.

The technical features of the above-described embodiments may be arbitrarily combined. To make the description concise, all possible combinations of the technical features in the above-described embodiments are not described. However, as long as there is no contradiction in the combinations of these technical features, these combinations all should be considered to be within the scope of the present disclosure.

The above-mentioned embodiments only express several implementation modes of the present disclosure, and the description thereof is relatively specific and detailed, but it should not be understood as limiting the scope of the present disclosure. It should be pointed out that, those skilled in the art can make several modifications and improvements without departing from the concept of the present disclosure, which all fall within the protection scope of the present disclosure. Therefore, the protection scope of the present disclosure should be subject to the appended claims.

What is claimed is:

1. A self-regulating fluid cooling system for an electronic device, comprising:
   - a plurality of cooling fluid flow branches connected in parallel, wherein each cooling fluid flow branch is connected to a cooling fluid driver and a heat exchanger through a pipeline to form a fluid cooling circulation loop;
   - cold plates, wherein each cooling fluid flow branch is provided with at least one of the cold plates and cooling fluid in the cooling fluid flow branch flows through the cold plate, and each cold plate is configured to be in contact and exchange heat with a corresponding heating region;

a plurality of regulation modules, provided in a one-to-one correspondence with the cold plates, wherein the regulation module is configured to regulate a flow rate of the cooling fluid flowing through the corresponding cold plate;

further comprising a cooling fluid flow main path, the cooling fluid driver, and the heat exchanger, wherein the cooling fluid driver and the heat exchanger are both provided on the cooling fluid flow main path, inlet ends of the plurality of cooling fluid flow branches are connected to an outlet end of the cooling fluid flow main path, outlet ends of the plurality of cooling fluid flow branches are connected to an inlet end of the cooling fluid flow main path, the cooling fluid driver is configured to drive the cooling fluid to circulate, and the heat exchanger is configured to cool down the cooling fluid;

wherein components in the regulation module are integrated into one.

2. The self-regulating fluid cooling system for the electronic device according to claim 1, wherein at least a part of components in the regulation module are dispersedly provided on the cooling fluid flow branch.

3. The self-regulating fluid cooling system for the electronic device according to claim 2, wherein the regulation module comprises a controller, a first temperature measuring member, and a second temperature measuring member and a valve both of which are provided on the cooling fluid flow branch, the first temperature measuring member is located on an inlet side of the cold plate, the second temperature measuring member is located on an outlet side of the cold plate, the first temperature measuring member, the second temperature measuring member, and the valve are all electrically connected to the controller, and the controller is configured to regulate an opening degree of the valve according to temperatures measured by the first temperature measuring member and the second temperature measuring member.

4. The self-regulating fluid cooling system for the electronic device according to claim 1, wherein the regulation module is provided on the cooling fluid flow branch at an outlet side of the corresponding cold plate.

5. The self-regulating fluid cooling system for the electronic device according to claim 1, further comprising a quick connector, wherein the regulation module is provided in the quick connector, the corresponding cold plate and the cooling fluid flow branch are both connected to the quick connector, and the quick connector is located at an outlet side of the cold plate.

6. The self-regulating fluid cooling system for the electronic device according to claim 1, further comprising a cooling fluid distribution unit in which a liquid collecting device is provided, wherein the outlet ends of the plurality of cooling fluid flow branches are all connected to the liquid collecting device, and a regulation module is provided at each connection between the liquid collecting device and each cooling fluid flow branch;

the cooling fluid distribution unit comprises a liquid diverting device and the liquid collecting device, the inlet ends of the plurality of cooling fluid flow branches are connected to the liquid diverting device, the outlet ends of the plurality of cooling fluid flow branches are connected to the liquid collecting device, and a regulation module is provided at each connection between the liquid collecting device and each cooling fluid flow branch.

7. The self-regulating fluid cooling system for the electronic device according to claim 1, wherein the regulation module is provided inside the corresponding cold plate.

8. The self-regulating fluid cooling system for the electronic device according to claim 4, wherein the regulation module comprises a temperature measuring member, a controller and a valve, the temperature measuring member and the valve are both electrically connected to the controller, and the controller is configured to regulate an opening degree of the valve according to a temperature measured by the temperature measuring member.

9. The self-regulating fluid cooling system for the electronic device according to claim 4, wherein the regulation module comprises a flow channel and at least one regulation member provided inside the flow channel, and the regulation member is capable of deforming with temperature changes to regulate a flow size of the flow channel.

10. The self-regulating fluid cooling system for the electronic device according to claim 4, wherein the regulation module comprises a flow channel and at least one regulation member provided in the flow channel, the regulation member is connected to a blocking member, the regulation member is configured to be capable of performing a phase change with temperature changes to drive the blocking member to move in the flow channel and regulate a flow size of the flow channel.

11. The self-regulating fluid cooling system for the electronic device according to claim 4, wherein the regulation module comprises a flow channel, at least one regulation member provided in the flow channel, and a temperature-sensitive elastic member connected to the regulation member, and the temperature-sensitive elastic member is configured to be capable of deforming with temperature changes to drive the regulation member to move in the flow channel and regulate a flow size of the flow channel.

12. The self-regulating fluid cooling system for the electronic device according to claim 4, wherein the regulation module comprises a valve, and a pressure of cooling fluid flowing through the valve varies with a temperature to push the valve to open or close.

* * * * *